(12) United States Patent
Burke et al.

(10) Patent No.: US 10,749,566 B2
(45) Date of Patent: Aug. 18, 2020

(54) DYNAMICALLY ADJUSTABLE RADIO-FREQUENCY (RF) FRONT-END

(71) Applicant: QUALCOMM Incorporated, San Diego, CA (US)

(72) Inventors: Joseph Patrick Burke, Glenview, IL (US); Ashwin Sampath, Skillman, NJ (US); Mohammad Ali Tassoudji, San Diego, CA (US); Robert Gilmore, Poway, CA (US); Vasanthan Raghavan, West Windsor Township, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/189,533

(22) Filed: Nov. 13, 2018

(65) Prior Publication Data

US 2020/0153476 A1    May 14, 2020

(51) Int. Cl.
| | |
|---|---|
| *H04B 7/0413* | (2017.01) |
| *H04B 1/525* | (2015.01) |
| *H03D 7/16* | (2006.01) |
| *H04B 1/04* | (2006.01) |
| *H03H 11/34* | (2006.01) |

(52) U.S. Cl.
CPC .......... *H04B 1/525* (2013.01); *H03D 7/165* (2013.01); *H03H 11/344* (2013.01); *H04B 1/0475* (2013.01); *H04B 7/0413* (2013.01)

(58) Field of Classification Search
CPC .... H04B 1/525; H04B 1/0475; H04B 7/0413; H03D 7/165; H03H 11/344
USPC ................................................. 455/323, 311
See application file for complete search history.

(56) References Cited

U.S. PATENT DOCUMENTS

| | | | | |
|---|---|---|---|---|
| 4,972,434 A | * | 11/1990 | Le Polozec | ............... H04L 1/06 375/232 |
| 6,754,475 B1 | * | 6/2004 | Harrison | .............. H04B 7/0615 455/115.1 |
| 7,027,786 B1 | * | 4/2006 | Smith | ...................... H03D 7/00 455/118 |

(Continued)

FOREIGN PATENT DOCUMENTS

EP    1906551 A2    4/2008

OTHER PUBLICATIONS

International Search Report and Written Opinion—PCT/US2019/056198—ISA/EPO—dated Dec. 10, 2019.

*Primary Examiner* — Hai V Nguyen
(74) *Attorney, Agent, or Firm* — Patterson & Sheridan, LLP

(57) ABSTRACT

Certain aspects of the present disclosure generally relate to radio frequency (RF) front-end circuitry. For example, certain aspects provide an apparatus having a first converter circuit configured to upconvert a first baseband (BB) signal to a first RF signal based on a mode of operation, and a second converter circuit configured to upconvert a second BB signal to a second RF signal based on the mode of operation. The apparatus also includes a first RF weight adjustment circuit configured to selectively apply an amplitude weight or a phase weight to at least one of the first RF signal or the second RF signal based on the mode of operation, and a controller configured to control a power state of the second converter circuit in dependence on the mode of operation.

29 Claims, 8 Drawing Sheets

(56) References Cited

U.S. PATENT DOCUMENTS

| | | | | |
|---|---|---|---|---|
| 7,132,908 B1* | 11/2006 | Kosinski | H03H 9/25 | 333/166 |
| 7,136,627 B2* | 11/2006 | Hamalainen | H04B 7/0634 | 455/101 |
| 7,146,134 B2* | 12/2006 | Moon | H04B 7/0811 | 455/67.11 |
| 7,149,258 B2* | 12/2006 | Nilsson | H04B 7/0634 | 375/316 |
| 7,392,015 B1* | 6/2008 | Farlow | H04B 17/21 | 342/387 |
| 7,489,673 B2* | 2/2009 | Yagi | H04B 7/2615 | 370/347 |
| 7,519,323 B2* | 4/2009 | Mohebbi | H04B 7/15507 | 455/11.1 |
| 7,610,019 B2* | 10/2009 | Moon | H04B 7/0811 | 455/101 |
| 7,619,997 B2* | 11/2009 | Rofougaran | H04B 7/0617 | 370/310.2 |
| 7,734,994 B2* | 6/2010 | Shoarinejad | G06K 7/0008 | 370/346 |
| 7,986,650 B2* | 7/2011 | Rofougaran | H04B 7/0617 | 370/310.2 |
| 8,086,174 B2* | 12/2011 | Mohebbi | H04B 7/1555 | 455/11.1 |
| 8,098,683 B2* | 1/2012 | Kent | H04B 7/0848 | 370/328 |
| 8,477,514 B2* | 7/2013 | Artusi | H02M 1/4225 | 363/21.01 |
| 8,477,803 B2* | 7/2013 | Kent | H04B 7/0848 | 370/328 |
| 8,526,345 B2* | 9/2013 | Rofougaran | H04B 7/0617 | 370/310.2 |
| 8,548,379 B2* | 10/2013 | Jin | H04W 52/42 | 455/41.1 |
| 8,750,414 B2* | 6/2014 | Rofougaran | H03F 3/189 | 375/296 |
| 8,817,825 B2* | 8/2014 | Kent | H04B 7/0842 | 370/335 |
| 8,873,685 B2* | 10/2014 | Dua | H04B 7/0877 | 375/267 |
| 8,891,478 B2* | 11/2014 | Kakishima | H04B 7/0417 | 370/329 |
| 9,014,621 B2* | 4/2015 | Mohebbi | H04B 7/1555 | 455/15 |
| 9,014,648 B2* | 4/2015 | Gudem | H04B 7/0871 | 455/133 |
| 9,048,913 B2* | 6/2015 | Kludt | H04B 7/0689 | |
| 9,071,311 B2* | 6/2015 | Chen | H04B 17/0085 | |
| 9,072,119 B2* | 6/2015 | Yang | H04W 88/06 | |
| 9,154,199 B2* | 10/2015 | Rofougaran | H04B 7/0617 | |
| 9,197,466 B2* | 11/2015 | Tarighat Mehrabani | H04L 27/14 | |
| 9,344,176 B2* | 5/2016 | Barker | H04B 7/0617 | |
| 9,544,042 B2* | 1/2017 | Li | H04B 7/0871 | |
| 9,680,553 B1* | 6/2017 | Tiebout | H04B 7/0408 | |
| 9,729,224 B2* | 8/2017 | Luschi | H04B 7/0874 | |
| 9,780,928 B2* | 10/2017 | Moshfeghi | H04B 7/0408 | |
| 9,787,386 B2* | 10/2017 | Strong | H04B 7/0617 | |
| 9,935,367 B2* | 4/2018 | Tiebout | H04B 7/0408 | |
| 10,033,450 B2* | 7/2018 | Strong | H04L 27/26 | |
| 10,171,126 B2* | 1/2019 | Chance | H04B 1/52 | |
| 10,218,069 B2* | 2/2019 | Gomadam | H01Q 3/34 | |
| 10,225,742 B2* | 3/2019 | Baldemair | H04B 7/0465 | |
| 10,305,611 B1* | 5/2019 | Rimini | G01S 13/345 | |
| 10,355,764 B2* | 7/2019 | Strong | H04B 7/0617 | |
| 2003/0099216 A1* | 5/2003 | Nilsson | H04L 25/0212 | 370/335 |
| 2003/0153358 A1* | 8/2003 | Moon | H04L 1/206 | 455/561 |
| 2005/0260954 A1* | 11/2005 | Hamalainen | H04B 7/0634 | 455/101 |
| 2006/0072629 A1* | 4/2006 | Kent | H04L 25/03019 | 370/516 |
| 2006/0079288 A1* | 4/2006 | Lindoff | H01Q 3/2605 | 455/562.1 |
| 2006/0258304 A1* | 11/2006 | Moon | H04B 7/0811 | 455/101 |
| 2007/0155314 A1* | 7/2007 | Mohebbi | H04B 7/15507 | 455/11.1 |
| 2008/0065957 A1* | 3/2008 | Shoarinejad | G06K 7/0008 | 714/758 |
| 2008/0075021 A1* | 3/2008 | Rofougaran | H04B 7/0669 | 370/277 |
| 2009/0034653 A1* | 2/2009 | Rofougaran | H04L 27/362 | 375/298 |
| 2009/0111542 A1* | 4/2009 | Luschi | H04B 7/02 | 455/575.7 |
| 2009/0325481 A1* | 12/2009 | Mohebbi | H04B 7/2606 | 455/15 |
| 2010/0144289 A1* | 6/2010 | Haskell | H01Q 3/30 | 455/83 |
| 2010/0149838 A1* | 6/2010 | Artusi | H02M 1/4225 | 363/20 |
| 2011/0045787 A1* | 2/2011 | Jin | H04W 52/42 | 455/114.3 |
| 2011/0103504 A1* | 5/2011 | Ma | H04B 7/0469 | 375/267 |
| 2011/0194650 A1* | 8/2011 | Lee | H04L 5/0023 | 375/316 |
| 2012/0082270 A1* | 4/2012 | Kent | H04L 25/03019 | 375/340 |
| 2012/0100802 A1* | 4/2012 | Mohebbi | H04B 7/1555 | 455/15 |
| 2012/0196530 A1* | 8/2012 | Moosavi | H04W 52/0251 | 455/41.1 |
| 2012/0306585 A1* | 12/2012 | Mack | H03B 5/30 | 331/182 |
| 2013/0044650 A1* | 2/2013 | Barker | H04B 7/0617 | 370/278 |
| 2013/0182672 A1* | 7/2013 | Kakishima | H04L 5/0053 | 370/329 |
| 2013/0194988 A1* | 8/2013 | Kubota | H04B 7/063 | 370/311 |
| 2014/0308986 A1* | 10/2014 | Yang | H04W 36/0088 | 455/552.1 |
| 2015/0103872 A1* | 4/2015 | Tarighat Mehrabani | H04L 27/14 | 375/219 |
| 2015/0111507 A1* | 4/2015 | Alpert | H04B 17/21 | 455/67.14 |
| 2015/0201378 A1* | 7/2015 | Song | H04W 52/0251 | 370/311 |
| 2015/0282057 A1* | 10/2015 | Li | H04B 7/0871 | 455/552.1 |
| 2016/0065188 A1* | 3/2016 | Singhal | H03K 3/356008 | 327/203 |
| 2016/0111950 A1* | 4/2016 | Duncan | H02M 3/158 | 323/268 |
| 2016/0134317 A1* | 5/2016 | Hu | H04W 68/02 | 455/558 |
| 2016/0261326 A1* | 9/2016 | Barker | H01Q 3/2605 | |
| 2017/0005408 A1* | 1/2017 | Gomadam | H01Q 21/0006 | |
| 2017/0117950 A1* | 4/2017 | Strong | H04B 7/0452 | |
| 2017/0139467 A1* | 5/2017 | Waters | G06F 13/385 | |
| 2017/0196044 A1* | 7/2017 | Nord | H04W 52/0258 | |
| 2017/0215144 A1* | 7/2017 | Sasson | H04L 27/2271 | |
| 2017/0262398 A1* | 9/2017 | Lugo | G06F 13/4221 | |
| 2018/0048373 A1* | 2/2018 | Strong | H04B 7/0617 | |
| 2018/0097443 A1* | 4/2018 | Couleur | H02M 3/07 | |
| 2018/0219708 A1* | 8/2018 | Kimura | H04J 15/00 | |
| 2018/0331745 A1* | 11/2018 | Strong | H04B 7/0617 | |
| 2019/0007906 A1* | 1/2019 | Hessler | H04W 52/0245 | |
| 2019/0166553 A1* | 5/2019 | Ryoo | H04W 76/20 | |
| 2019/0173171 A1* | 6/2019 | Gomadam | H01Q 3/28 | |
| 2019/0334605 A1* | 10/2019 | Strong | H04B 7/0452 | |
| 2019/0385668 A1* | 12/2019 | Fujioka | G11C 11/4074 | |

\* cited by examiner

DYNAMICALLY ADJUSTABLE RADIO-FREQUENCY (RF) FRONT-END

TECHNICAL FIELD

Certain aspects of the present disclosure generally relate to electronic circuits and, more particularly, to radio frequency (RF) front-end circuitry.

BACKGROUND

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include radio frequency (RF) front-end circuitry, which may be used for communication within a millimeter wave (mmW) communication band, for example.

SUMMARY

Certain aspects of the present disclosure generally relate to radio frequency (RF) front-end circuitry. For example, certain aspects provide an apparatus having a first converter circuit configured to upconvert a first baseband (BB) signal to a first RF signal based on a mode of operation, and a second converter circuit configured to upconvert a second BB signal to a second RF signal based on the mode of operation. The apparatus also includes a first RF weight adjustment circuit configured to selectively apply an amplitude weight or a phase weight to at least one of the first RF signal or the second RF signal based on the mode of operation, and a controller configured to control a power state of the second converter circuit in dependence on the mode of operation.

Certain aspects of the present disclosure are directed to a method for wireless communications. The method generally includes upconverting, via a first converter circuit, a first BB signal to a first RF signal based on a mode of operation; upconverting, via a second converter circuit, a second BB signal to a second RF signal based on the mode of operation; selectively applying an amplitude weight or a phase weight to at least one of the first RF signal or the second RF signal based on the mode of operation; and controlling a power state of the second converter circuit in dependence on the mode of operation.

Certain aspects of the present disclosure are directed to a method for wireless communications. The method generally includes downconverting, via a first converter circuit, a first RF signal to a first BB signal based on a mode of operation; downconverting, via a second converter circuit, a second RF signal to a second BB signal based on the mode of operation; selectively applying an amplitude weight or a phase weight to at least one of the first RF signal or the second RF signal based on the mode of operation; and controlling a power state of the second converter circuit in dependence on the mode of operation.

Certain aspects of the present disclosure generally relate to an apparatus for wireless communications. The apparatus generally includes means for upconverting a first BB signal to a first RF signal based on a mode of operation, means for upconverting a second BB signal to a second RF signal based on the mode of operation, means for selectively applying an amplitude weight or a phase weight to at least one of the first RF signal or the second RF signal based on the mode of operation, and means for controlling a power state of the means for upconverting the second BB signal, in dependence on the mode of operation.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
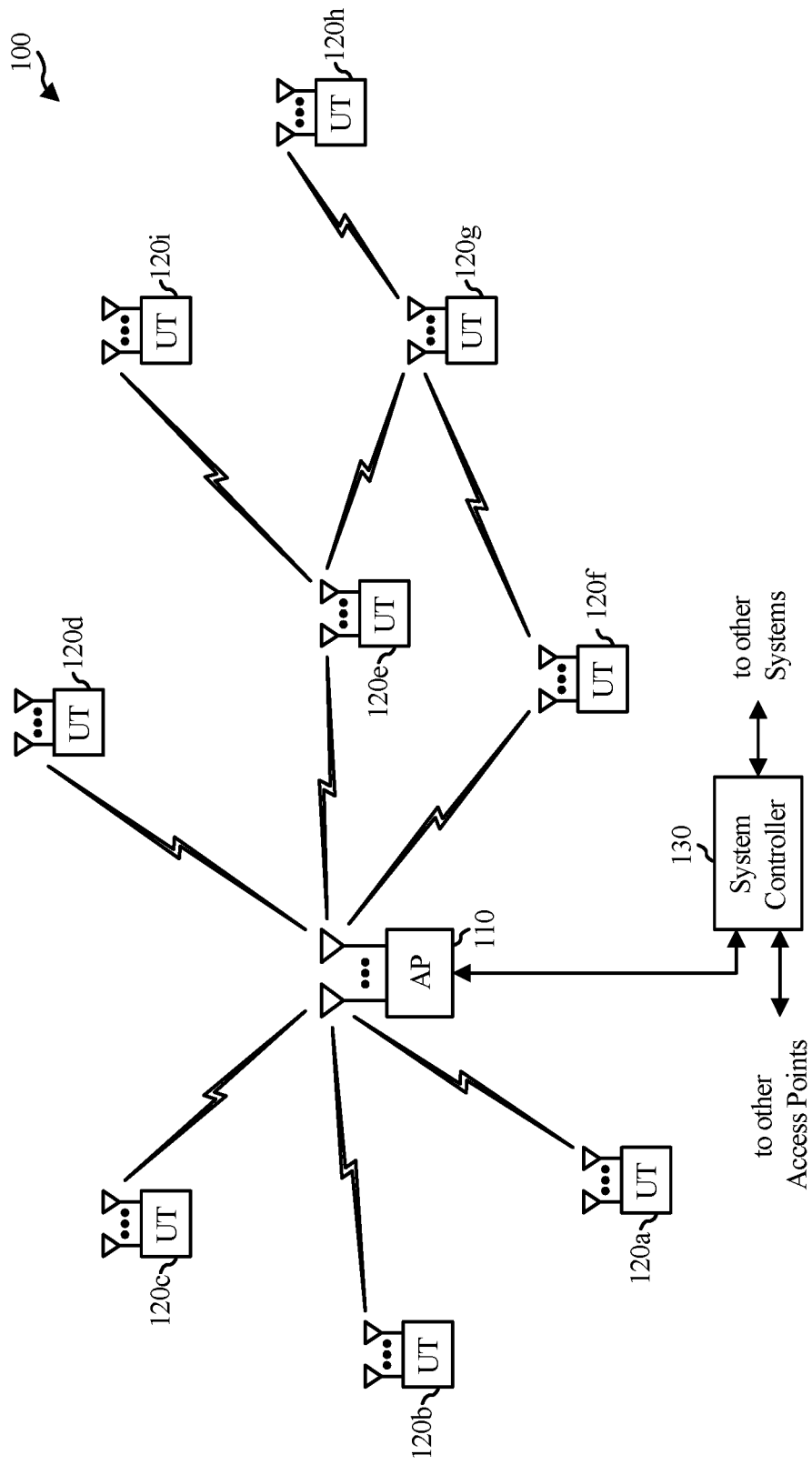
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include a frequency converter circuit for processing signals for transmission or reception via multiple radiofrequency (RF) circuits having a signal path selectively coupled therebetween, as described in more detail herein.

Figure 2:
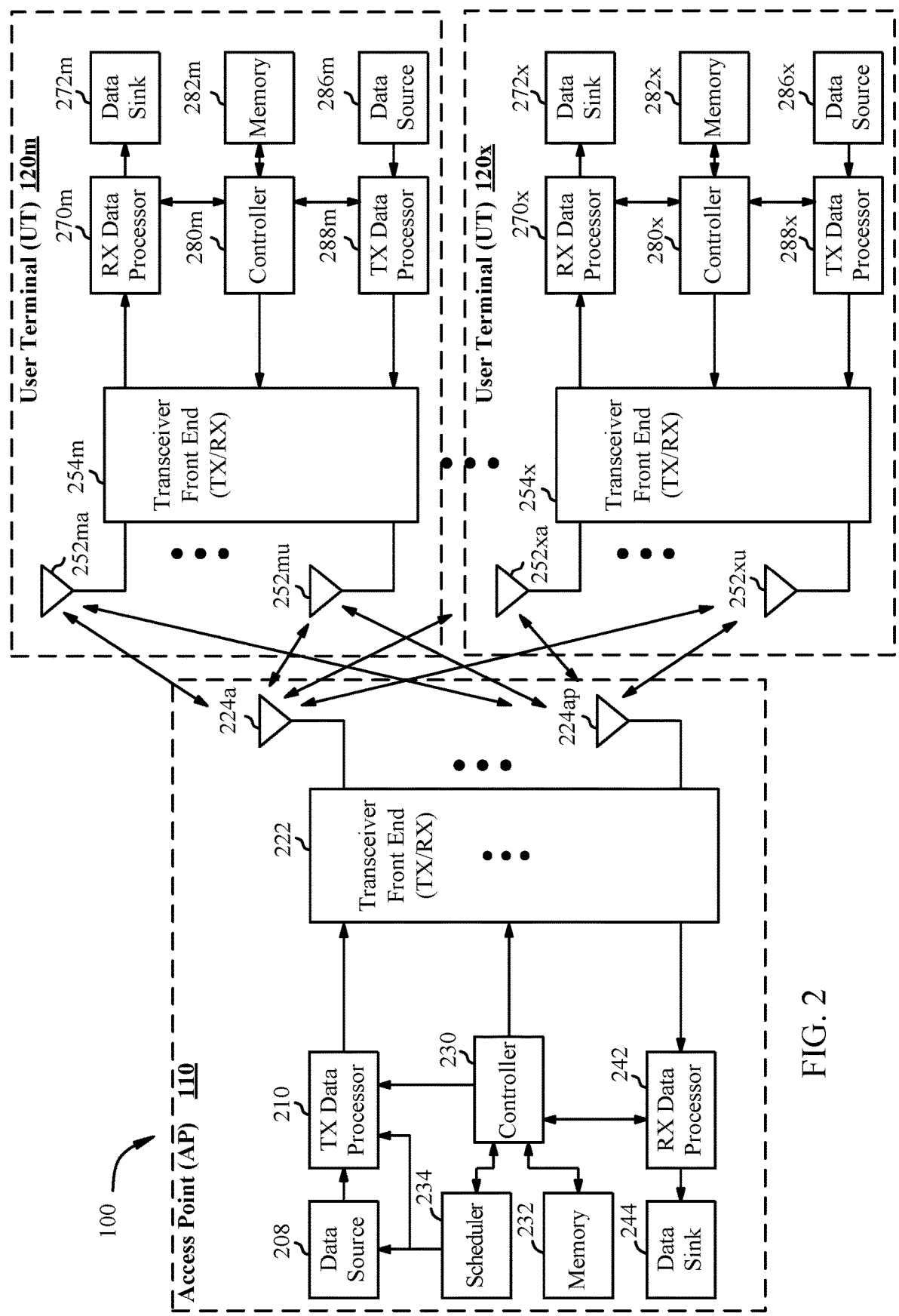
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering, beamforming, or some other spatial processing technique may be used at the access point and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. The transceiver front end (TX/RX) 222 of access point 110 and/or transceiver front end 254 of user terminal 120 may include a frequency converter circuit for processing signals for transmission or reception via multiple radio-frequency (RF) circuits having a signal path selectively coupled therebetween, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one or more of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
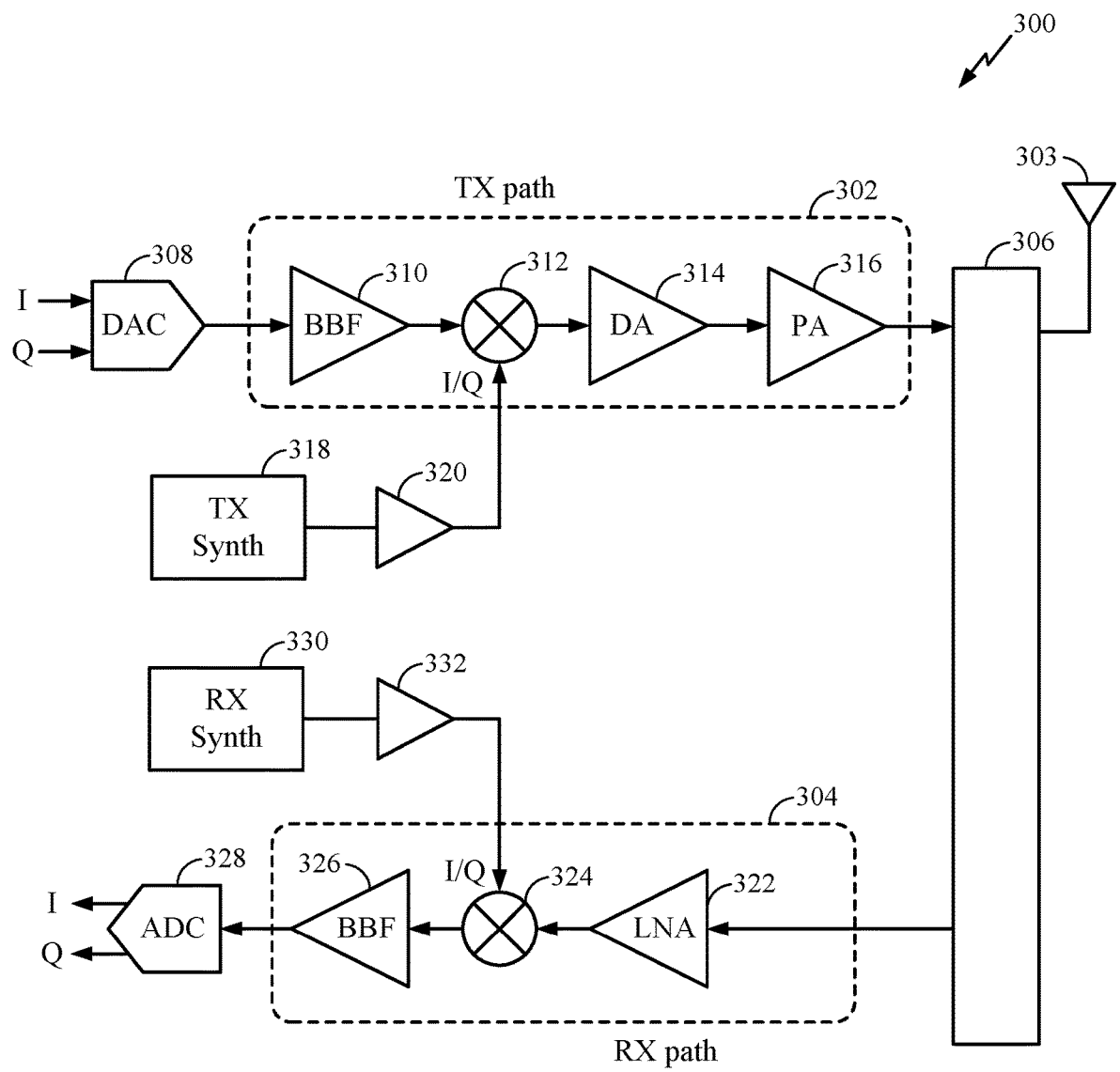
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

Although the block diagram of FIG. 3 depicts the transceiver front end 300 as a single conversion transceiver utilizing quadrature modulation and demodulation, aspects of the present disclosure are not limited to this configuration. For example, one or more of the TX path 302 or the RX path can be configured as a superheterodyne configuration utilizing more than one frequency conversion. Similarly, the transceiver front end 300 is illustrated with quadrature modulation and demodulation, but may alternatively be implemented with polar modulation/demodulation. In a polar modulation configuration, the TX path 302 would receive phase and amplitude signals from a baseband module and use these signals to phase and amplitude modulate a constant-envelope RF or IF signal.

While it is desirable for the output of an LO to remain stable in frequency, tuning the LO to different frequencies typically entails using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324. In certain aspects of the present disclosure, the mixers 312 and 324 may be configured to perform upconversion and downconversion, respectively, of signals for multiple RF circuits (e.g., each including a PA, such as the PA 316, and/or an LNA, such as the LNA 322), as described in more detail herein.

Example Techniques for Wireless Communication Using Weight Adjustment in the RF Domain Current millimeter wave (mmW) radios use radio-frequency (RF) beamforming (BF) to increase signal gain or provide directionality. BF generally refers to a process used to control the directionality of transmission and/or reception of radio signals to increase the signal gain in a particular direction. The beamforming process can help address one of the problems for communication at the mmW spectrum, which is the high path loss of the mmW communication. As such, an array of antennas may be placed at each transceiver to exploit the beamforming gain and extend the communication range. For example, the same signal may be sent from each antenna in the array, but at slightly different amplitudes and phases in order for the signal transmission to be focused in a particular direction towards a receiver. The communication device, for example the user terminal 120 of FIG. 2, may be configured to apply the amplitude and phase control, referred to as amplitude and phase weighting, at one or more positions in the transmit and/or receive path. For example, the weights may be applied at baseband in the digital domain or in the analog domain, at IF, and/or at RF.

To improve reliability, a diversity mode for transmission and reception may be used, where multiple antennas or multiple antenna arrays are used to transmit or receive the same signal. Transmitting or receiving the same, or substantially the same, signal via multiple spaced antennas provides spatial diversity. Typically, a spacing between antennas on the order of one wavelength is sufficient for spatial diversity. In the transmit path, utilizing multiple transmit antennas introduces distinct channel conditions experienced by each communication link from a particular antenna to an intended receiver, provided there is sufficient physical spacing between the antennas. Similarly, in the receive path, utilizing multiple receive antennas introduces distinct channel conditions from a transmitting device to each or the receive antennas, provided there is sufficient spacing between the antennas. A signal source may transmit a single signal to the receiver, but each receive antenna of the group of antennas configured as diversity antennas sees a different receive signal quality, due to the different channel conditions from the signal source to each receive antenna. Spatial diversity can be particularly beneficial where at least one of the group of antennas configured as diversity antennas experiences poor channel conditions, such as a deep fade. Utilizing spatial diversity improves the likelihood that at least one of the antennas will experience sufficient channel quality to close the communication link.

Beamforming and diversity may be independently configured, but are not mutually exclusive. That is, a communication device, such as the user terminal 120 of FIG. 2, can be configured to support multiple operational modes. For example, one operational mode, the transmitter or receiver can be configured to support diversity, while in another operational mode, the transmitter or receiver can be configured to support beamforming or one or a plurality of independent streams. In yet another operational mode, the transmitter or receiver can be configured to support both diversity and beamforming.

In some cases, diversity radios may use baseband (BB) signal processing techniques to perform amplitude and/or phase weighting to the transceiver waveforms at baseband frequencies via a digital signal processor (DSP). For example, a BB module may be coupled to multiple converter modules each including analog-to-digital and digital-to-analog conversion circuitry for processing signals to or from one of multiple RF circuits in order to support communication features such as two-way diversity or carrier aggregation (CA). Certain aspects of the present disclosure are generally directed to reducing power consumption by implementing amplitude and/or phase weighting in the RF domain in a manner that allows for one or more converter circuits to be powered down during particular operational modes.

Figure 4A:
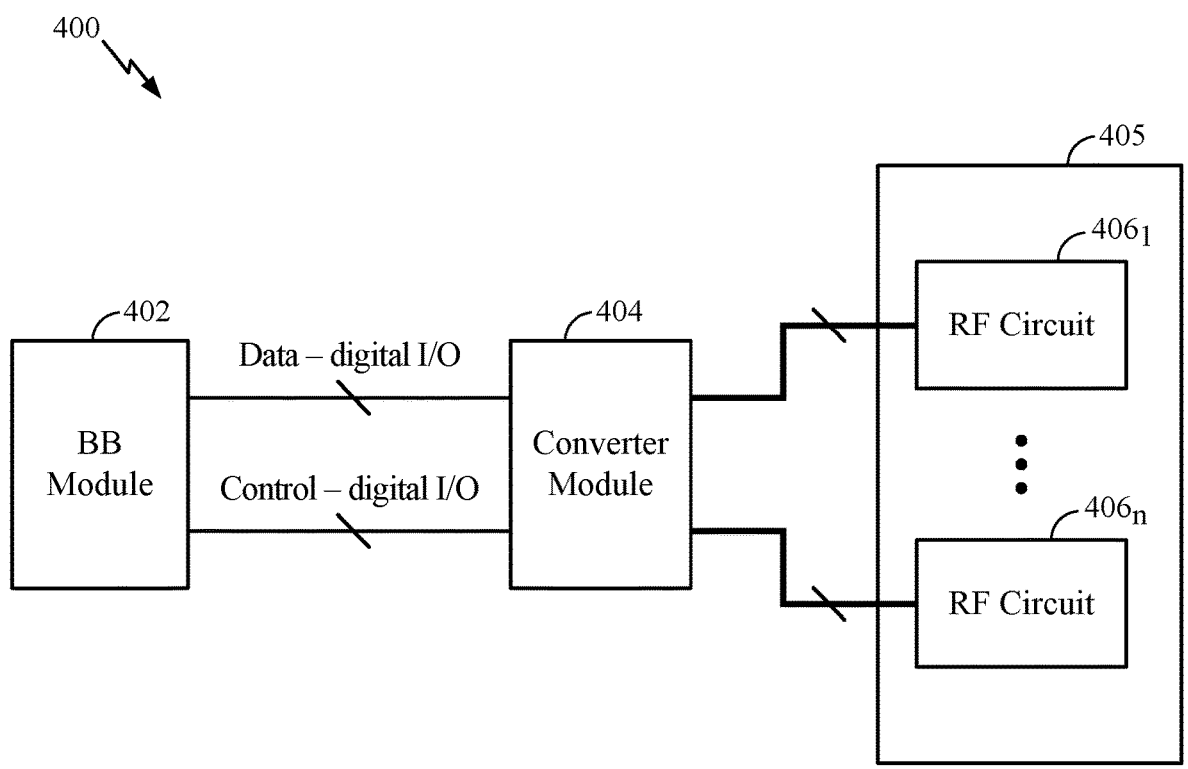
FIG. 4A is a block diagram illustrating an example circuit topology for a wireless communications device, in accordance with certain aspects of the present disclosure.

FIG. 4A illustrates a wireless communications topology 400, in accordance with certain aspects of the present disclosure. The topology 400 includes a baseband (BB) module 402 for generating BB signals or receiving BB signals for processing in the digital domain. As illustrated, the BB module 402 may provide and/or receive data (e.g., BB signals) via a digital input/output (I/O) bus.

The converter module 404 may include circuitry for converting the BB signals received from the BB module 402 to RF signals (or intermediate frequency (IF) signals) for transmission, or during reception, convert RF signals (or IF signals) to BB signals. The RF signals may be provided to or received from multiple RF circuits $406_1$ to $406_n$ (collectively referred to as "RF circuits 406") which may be implemented in an RF integrated circuit (RFIC) 405. For example, a separate RF chain (e.g., a transmit/receive chain) may be implemented in each of the RF circuits 406 to support diversity communication or two-layer multiple-input, multiple-output (MIMO) communication. Each of the RF circuits 406 may include multiple communication channels, each coupled to an antenna of an antenna array, to facilitate beamforming. In certain aspects, the BB module 402 may also generate control signals for controlling operations of the RF circuits 406, as described in more detail herein.

Figure 4B:
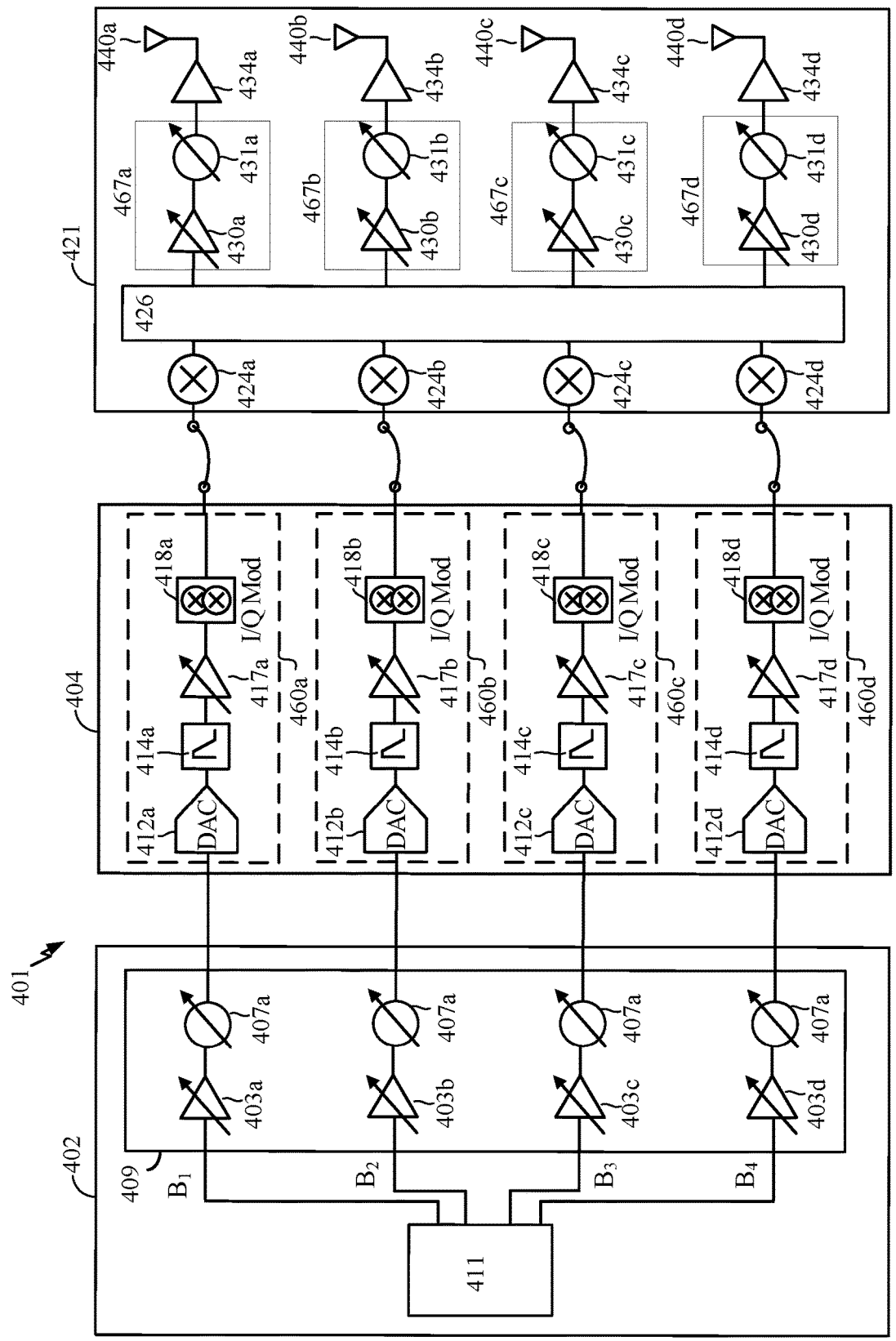
FIG. 4B is a block diagram illustrating an example wireless communications circuit, in accordance with certain aspects of the disclosure.

FIG. 4B illustrates an example of a simplified wireless communications circuit 401, such as may be implemented in the topology 400 of FIG. 4A. In the wireless communications circuit 401, only a simplified structure of the transmit path is shown. Additional processors, memory, controllers, and receive path that may be incorporated in a wireless communication device, such as the user terminal 120 of FIG. 2, are omitted for purposes of clarity. The wireless communications circuit 401 includes a BB module 402 coupled to a converter module 404 that is coupled to an RF Front End (RFFE) module 421.

In the example of FIG. 4B, the BB module 402 includes a BB processor 411 configured to generate up to four data streams. The example of FIG. 4B utilizes four distinct data streams for the purposes of illustration, and the number of data streams can be any number of data streams. The different operational modes discussed herein rely on one or multiple data streams, but the plurality of data streams is not limited to four. Depending on the operational mode, each of the data streams may be independent and distinct from the other data streams. Alternatively, a plurality of the data streams, up to and including all of the data streams, can be the same data stream. As an example, each of the data streams can represent the data from a Carrier Aggregation channel or a MIMO data stream.

The BB processor 411 couples the plurality of data streams to a digital beamforming module 409. The digital beamforming module 409 includes a plurality of amplitude weighting modules, 403a-403d, and phase weighting modules, 407a-407d. Each of the plurality of data streams is coupled to a corresponding amplitude weighting module 403 and phase weighting module 407. The order of amplitude weighting module 403 and phase weighting module 407 may be as shown in FIG. 4B or may be in reverse order. Each amplitude weighting module, e.g. 403a, is depicted as a variable gain amplifier to illustrate its functionality. That is, an amplitude weighting module, e.g. 403a, can be configured to vary the amplitude of the data stream received from the BB processor 411. Each phase weighting module, e.g. 407a, is depicted as a phase shifter to illustrate its functionality.

The BB processor 411 couples the first data stream to a first amplitude weighting module 403a in series with a first phase weighting module 407a. Similarly, the BB processor 411 couples the second data stream to a second amplitude weighting module 403b in series with a second phase weighting module 407b. The second and third data streams are similarly connected to respective weighting modules within the digital beamforming module 409.

Each of the weighted data streams is coupled to a respective input of a converter circuit 460a-460d of a converter module 404. In the transmit path, each converter circuit, e.g. 460a, is configured to upconvert received BB signals to a complex modulated IF signal. Each of the converter circuits 460a-460d includes a DAC 412a-412d, BB filter 414a-414d, variable gain amplifier 417a-417d, and mixers 418a-418d. For example, the first converter circuit 460a includes a DAC 412a coupled to a BB filter 414a. The output of the BB filter 414a is coupled to a variable gain amplifier 417a, which drives one or more mixers 418a driven by a Local Oscillator (not shown) to upconvert the BB data stream to a complex modulated IF signal. The second through fourth converter circuits, 460b-460d, are implemented in the same fashion as the first converter circuit 460a. Each converter circuit, 460a-460d, upconverts a respective weighted data stream to an IF signal.

The plurality of outputs of the converter module 404 are coupled to a RFFE module 421. The RFFE module 421 includes a plurality of mixers 424a-424d, each configured to upconvert an IF signal from the converter module 404 to a respective RF signal. The outputs from the four mixers 424a-424d are coupled to inputs of a configurable signal splitter 426. The configurable signal splitter 426 can provide a plurality of outputs, each of a plurality of output signals coupled to one of a plurality of weight adjustment circuits 467a-467d. Each weight adjustment circuit, e.g. 467a, is configured to adjust an amplitude and/or phase of a transmit signal from the configurable signal splitter 426. Each weight adjustment circuit, e.g. 467a, includes a variable gain amplifier, e.g. 430a, in series with a variable phase shifter, e.g. 431a.

A first output from the configurable signal splitter 426 is coupled to a first weight adjustment circuit 467a, including a first variable gain amplifier 430a and first variable phase shifter 431a. Similarly, a second output from the configurable signal splitter 426 is coupled to a second weight adjustment circuit 467b, including a second variable gain amplifier 430b and second variable phase shifter 431b. A third output from the configurable signal splitter 426 is coupled to a third weight adjustment circuit 467c, including a third variable gain amplifier 430c and third variable phase shifter 431c. A fourth output from the configurable signal splitter 426 is coupled to a fourth weight adjustment circuit 467d, including a fourth variable gain amplifier 430d and fourth variable phase shifter 431d.

An output from each of the plurality of weight adjustment circuits, 467a-467d, is coupled to a respective Power Amplifier (PA), 434a-434d, and antenna 440a-440d. The output from the first weight adjustment circuit 467a is coupled to a first PA 434a and first antenna 440a. The output from the second weight adjustment circuit 467b is coupled to a second PA 434b and second antenna 440b. The output from the third weight adjustment circuit 467c is coupled to a third PA 434c and third antenna 440c. The output from the fourth weight adjustment circuit 467d is coupled to a fourth PA 434d and fourth antenna 440d.

The use and configuration of the individual data streams, digital beamforming module 409, plurality of converter circuits 460a-460d, configurable signal splitter 426, and plurality of weight adjustment circuits 467a-467d can depend upon an operational mode. The operational mode can control whether beamforming weights are applied in the digital domain, analog domain, both digital and analog domains, or neither digital nor analog domains.

In a first operational mode, the wireless communications circuit 401 can be configured to generate four independent data streams that are transmitted with no beamforming and no spatial diversity supporting the same data stream. In the first operational mode, the BB processor 411 generates four independent data streams and couples each of the independent data streams to a respective input of the digital beamforming module 409. The digital beamforming module 409 can be configured to provide no amplitude or phase weighting to any of the data streams. Even if the digital beamforming module 409 were to provide amplitude and/or phase weighting to one or more of the data streams, such weighting would have no real effect, as each data stream will be directed to only one respective antenna, and each data stream is independent of the other data streams. Each of the four BB data stream outputs from the BB module 402 are coupled to a respective input of one of four converter circuits 460a-460d.

The converter circuits 460a-460d upconvert the four data streams to four independent IF signals. The converter circuits 460a-460d couple each of the four independent IF signals to a respective input of the RFFE module 421. The mixers 424a-424d upconvert their respective IF signals to an RF signal. The frequency of the IF signals may be the same frequency or different frequencies. Similarly, the frequencies of each of the independent RF signals may be the same or different frequencies.

The configurable signal splitter 426 can be configured to provide signal passthrough and no signal splitting. Each of the independent RF signals input to the configurable signal splitter 426 is routed to a distinct output. For example, the first RF signal from the first mixer 424a can be routed to the first weight adjustment circuit 467a, the second RF signal from the second mixer 424b can be routed to the second weight adjustment circuit 467b, the third RF signal from the third mixer 424c can be routed to the third weight adjustment circuit 467c, and the fourth RF signal from the fourth mixer 424d can be routed to the fourth weight adjustment circuit 467d. Each of the plurality of weight adjustment circuits 467a-467d can be configured to provide no amplitude or phase weighting. The outputs from each of the plurality of weight adjustment circuits 467a-467d is coupled to a respective PA 434a-434d and antenna 440a-440d. Because each data stream is independent, the wireless communications circuit 401 is configured to transmit four independent RF signals. Because each RF signal is provided to only one antenna, e.g. 440a, the wireless communication circuit 401 provides no beamforming.

In a second operational mode, the wireless communications circuit 401 can be configured to generate two independent data streams that are transmitted. Each of the two data streams can utilize beamforming and no spatial diversity supporting the same data stream. The wireless communication circuit 401 can be configured to implement beamforming in the digital domain, the analog domain, or in both the digital domain and the analog domain.

In the second operational mode, the BB processor 411 generates two independent data streams and couples each of the independent data streams to two inputs of the digital beamforming module 409. In the wireless communication circuit of FIG. 4B, data streams $B_1$ and $B_2$ can represent the same first data stream, and data streams $B_3$ and $B_4$ can represent the same second data stream. The digital beamforming module 409 can be configured to beamform the first data stream by applying amplitude and phase weighting using the first amplitude weighting module 403a and first phase weighting module 407a. Similarly, the digital beamforming module 409 can be configured to beamform the second data stream by applying amplitude and phase weighting using the third amplitude weighting module 403c and third phase weighting module 407c. The digital beamforming module 409 is thus configured to output two weighted versions of the first data stream at its first and second outputs and two weighted versions of the second data stream at its third and fourth outputs.

The four outputs from the digital beamforming module 409 are coupled to respective inputs of the plurality of converter circuits 460a-460d. The converter circuits 460a-460d upconvert the four data streams to four IF signals. Two of the IF signals, e.g. from converter circuits 460a and 460b, represent weighted versions of a first IF data stream, and the other two IF signals, e.g. from converter circuits 460c and 460d, represent weighted versions of a second IF data stream. The converter circuits 460a-460d couple each of the four IF signals to a respective input of the RFFE module 421.

The mixers 424a-424d upconvert their respective IF signals to an RF data stream. Thus, in the second operational mode, an output from the first mixer 424a and an output from the second mixer 424b represent weighted versions of a first RF data stream. Similarly, an output from the third mixer 424c and an output from the fourth mixer 424d represent weighted versions of a second RF data stream. The RF signals are coupled to the configurable signal splitter 426 that is configured to provide signal passthrough and no signal splitting.

Each of the plurality of weight adjustment circuits 467a-467d can be configured to provide no amplitude or phase weighting. The outputs from each of the plurality of weight adjustment circuits 467a-467d is coupled to a respective PA 434a-434d and antenna 440a-440d. The weighted versions of the first RF data stream are transmitted via the first and second antennas 440a and 440b. The weighted RF signals result in beamforming of the first RF data stream via the first antenna 440a and second antenna 440b. Similarly, the weighted versions of the second RF data stream are transmitted via the third and fourth antennas 440c and 440d. The weighted RF signals result in beamforming of the second RF data stream via the third antenna 440c and fourth antenna 440d.

In the digital beamforming example of the second operational mode described above, beamforming of the first and second data streams was achieved entirely in the digital domain. However, in the second operational mode, beamforming may be achieved in the analog domain in the RFFE module 421. Performing beamforming in the RFFE module 421 may be advantageous as it permits transitioning of one or more circuits or modules to low power, sleep, power down, or otherwise reduced power state.

In an alternative, analog beamforming implementation of the second operational mode, the wireless communications circuit 401 can be configured to generate two independent data streams that are transmitted. The BB processor 411 generates two independent data streams and couples each of the independent data streams to one input of the digital beamforming module 409. For example, the BB processor 411 can couple a first BB data stream, $B_1$, and a second BB data stream, $B_3$, to the digital beamforming module 409. The BB processor 411 does not need to generate replicas of the first BB data stream or second BB data stream, and thus, there are no data streams corresponding to streams $B_2$ and $B_4$ in FIG. 4B.

Because, in this example, beamforming will be achieved entirely in the RFFE module 421, the digital beamforming module 409 is configured to perform passthrough with no amplitude or phase weighting applied to the first data stream or second data stream. Alternatively, the BB processor 411 can bypass the digital beamforming module 409 and route the first BB data stream and second BB data stream to the first converter circuit 460a and third converter circuit 460c, respectively.

The first converter circuit 460a and third converter circuit 460c upconvert their BB data streams to respective first IF signal and second IF signal. The first converter circuit 460a couples the first IF signal to the first mixer 424a of the RFFE module 421. The third converter circuit 460c couples the second IF signal to the third mixer 424c of the RFFE module 421.

The first mixer 424a upconverts the first IF signal to a first RF signal and couples the first RF signal to the configurable signal splitter 426. Similarly, the third mixer 424c upconverts the second IF signal to a second RF signal and couples the second RF signal to the configurable signal splitter 426. The configurable signal splitter 426 is configured to split the first RF signal and provide replicas of the first RF signal to the first weight adjustment circuit 467a and the second weight adjustment circuit 467b. Similarly, the configurable signal splitter 426 is configured to split the second RF signal and provide replicas of the second RF signal to the third weight adjustment circuit 467c and the fourth weight adjustment circuit 467d.

The first weight adjustment circuit 467a is configured to apply beamforming amplitude and phase weights to the first RF signal. The third weight adjustment circuit 467c is configured to apply beamforming amplitude and phase weights to the second RF signal. In this example, the second weight adjustment circuit 467b and the fourth weight adjustment circuit 467d need not apply any amplitude or phase weights to their respective RF signals, as the relative weighting can be wholly supplied by the other RF path.

The outputs from the first through fourth weight adjustment circuits 467a-467d are coupled to respective PAs 434a-434d and antenna 440a-440d for transmission. The first RF signal is beamformed via the weighted signals from the first and second antennas 440a-440b, while the second RF signal is beamformed via the weighted signals from the third and fourth antennas 440c-440d.

In the example of the second operational mode where beamforming is performed entirely in the RFFE module 421, numerous redundant circuits remain unused and can be powered down or otherwise placed in a low power consumption state. For example, the digital beamforming module 409 module may be completely avoided, and if it is implemented as distinct circuits, those circuits can transition to a low power state during this implementation of the second operational mode. The second converter circuit 460b and the fourth converter circuit 460d are unused and can be powered down or otherwise transitioned to low power consumption state. Similarly, the second mixer 424b and fourth mixer 424d in the RFFE module 421 are unused and can be powered down. Other circuits, such as amplifiers or buffers (not shown) for unused LO signals can transition to low power state. Overall, the wireless communications circuit 401 can selectively transition one or more circuits into a low power state in dependence upon a beamforming operational mode.

Another example of an operational mode is spatial diversity based on the physical distance between the antennas 440a-440d. In one example of a diversity operational mode, a single RF signal is transmitted using a plurality of diversity antennas, e.g. 440-440d.

In an example of diversity operational mode, the BB processor 411 is configured to generate a single BB data stream. The BB module 402 couples the BB data stream to a first converter circuit 460a. The digital beamforming module 409 can be bypassed or otherwise configured to provide no amplitude or phase weighting.

The first converter circuit 460a upconverts the BB data stream to an IF signal. The second through fourth converter circuits 460b-460d are unused and can be powered down. The output of the first converter circuit 460a is coupled to the first mixer 424a of the RFFE module 421.

The first mixer 424a upconverts the IF signal to an RF signal and couples the RF signal to the configurable signal splitter 426. The second through fourth mixer 424b-424d remain unused and can be powered down. The configurable signal splitter 426 is configured to split the RF signal into four replicas. Each of the four replica RF signals is coupled to a respective input of the first through fourth weight adjustment circuits 467a-467d.

If spatial diversity with no beamforming is desired, the first through fourth weight adjustment circuits 467a-467d can be configured to provide no amplitude or phase weighting of their respective RF signals. The outputs from the first through fourth weight adjustment circuits 467a-467d are coupled to respective PAs 434a-434d and antenna 440a-440d for transmission.

Alternatively, if beamforming is desired, first through fourth weight adjustment circuits 467a-467d can be configured to provide amplitude and phase weights to their respective RF signals. In some configurations, only three of the weight adjustment circuits 467a-467d may provide amplitude and phase weights, as the weighting is a relative weighting and one of the RF signals can serve as a reference. For example, each of the second through fourth weight adjustment circuits 467b-467d can be configured to provide amplitude and phase weights such that the signals transmitted by the four antennas 440a-440d beamform to provide directionality in a desired direction.

In an example, the first and second weight adjustment circuits 467a, 467b can be configured to provide different weighting relative to the weighting provided by the third and fourth weight adjustment circuits 467c, 467d such that two distinct beams are formed. The signals transmitted by the first antenna 440a and the second antenna 440b can combine to form a first beam having directionality along a first direction. The signals transmitted by the third antenna 440c and the fourth antenna 440d can combine to form a second beam having directionality along a second direction, where the second direction can be the same or different from the first direction. In this example, distinct beams along different directions can provide significant transmit signal diversity.

While the wireless communications circuit 401 is described as having four signal paths and supporting four signal streams, the present disclosure is not limited to four antenna or four signal paths. It is apparent that the directionality and gain provided by beamforming and the number of independent beams may extend to any number of antennas, and is not limited on to any specific plurality of antennas. The wireless communications circuit 401 can be configured to reduce power consumption under particular operational modes in dependence on a diversity or beamforming mode. In particular, beamforming implemented using common signal paths may permit power savings by permitting power down of unutilized independent paths. In the case of an operational diversity mode, increasing the utilization of common signal paths permits reduction in power consumption by permitting power down of unutilized independent paths.

While the description of power savings based on operational mode has been describe in conjunction with transmit signal processing, power savings in dependence on operational mode is not limited to transmit signal processing. One can appreciate that spatial diversity and beamforming may be implemented within a receiver as well as a transmitter, and the techniques for power conservation apply equally to operational modes in the receiver.

Figure 5:
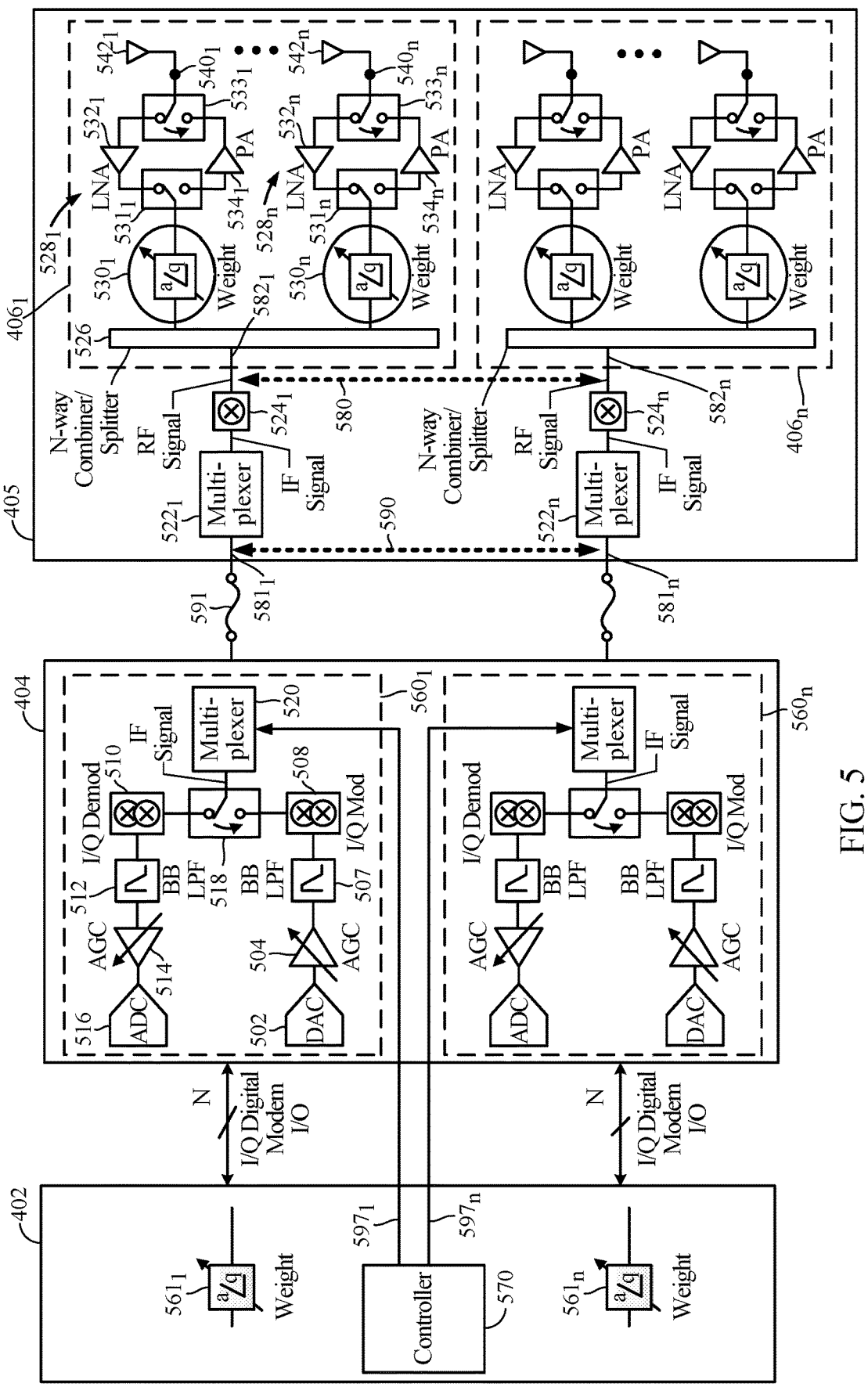
FIG. 5 illustrates an example wireless communications circuit, in accordance with certain aspects of the present disclosure.

FIG. 5 illustrates an example wireless communications circuit 500, in accordance with certain aspects of the present disclosure. The converter module 404 may include multiple converter circuits $560_1$ to $560_n$ (collectively referred to as "converter circuits 560"), each coupled to a respective one of the RF circuits 406 in the RFIC 405. In certain aspects, each of the converter circuits 560 may have a transmit chain and a receive chain for upconverting and downconverting signals, respectively. Each of the converter circuits 560 may receive digital signals from the BB module 402 during transmission or provide digital signals to the BB module 402 during reception, as described in more detail herein. For example, the converter circuit $560_1$ may have a transmit chain including a digital-to-analog converter (DAC) 502 (e.g., corresponding to the DAC 308 of FIG. 3) for converting the digital signals received from the BB module 402 to analog signals. The analog signals generated by the DAC 502 may be regulated using an automatic gain control (AGC) amplifier 504, and filtered using a BBF 507 (e.g., corresponding to the BBF 310 of FIG. 3), as illustrated. The filtered signal at the output of the BBF 507 may be mixed with local-oscillator (LO) signals via an in-phase (I)/quadrature (Q) modulator 508 to generate I and Q signals. The I/Q modulator 508 may include multiple mixers to generate the I/Q signals, as described with respect to the mixer 312 of FIG. 3. In certain aspects, the I/Q signals generated by the I/Q modulator 508 may be at an intermediate frequency (IF), which may be upconverted to RF using a mixer in the RFIC as illustrated in FIG. 5, but for other aspects, the I/Q signals may be directly converted to RF to avoid multiple upconversion stages.

Similarly, the receive chain may include an I/Q demodulator 510 for demodulating I/Q signals received from the RFIC 405 and may generate BB signals. For example, a BBF 512 (e.g., corresponding to the BBF 326 of FIG. 3) may be used to filter the output of the I/Q demodulator 510, an AGC amplifier 514 may be used to regulate the filtered signal from the BBF 512, and an analog-to-digital converter (ADC) 516 (e.g., corresponding to the ADC 328 of FIG. 3) may be used to generate digital BB signals to be provided to the BB module 402 for processing.

In some cases, a switch 518 may be used to couple either the receive chain or the transmit chain of the converter circuit $560_1$ to the RFIC 405. In certain aspects, a multiplexer 520 may be used to multiplex (or demultiplex) signals to be provided to (or received from) the RFIC 405 via a transmission line 591. For example, the multiplexer 520 may multiplex the IF signal generated at the output of the I/Q demodulator 510, the LO signal used to upconvert the BB signals, and a control signal (e.g., control signal $597_1$) from the BB module 402, and provide the multiplexed signal to the RFIC 405. As illustrated, each of the converter circuits 560 may be implemented in a similar fashion as described with respect to converter circuit $560_1$.

In certain aspects, the RFIC 405 may include multiplexers $522_1$ to $522_n$ (collectively referred to as "multiplexers 522")

to demultiplex the multiplexed signals received from the converter circuits 560 for transmission. The multiplexers 522 may also be used to multiplex signals received from a respective one of the RF circuits 406 during reception. The multiplexers 522 may generate (e.g., extract) the IF signal, the LO signal, and the control signal from the multiplexed signals received from the converter circuits 560 and provide the extracted signals to a respective one of the RF circuits 406. The IF signals generated at the outputs of the multiplexers 522 may be upconverted using respective mixers $524_1$ to $524_n$ (collectively referred to as "mixers 524") by mixing each of the IF signals with one of the LO signals to generate the RF signals at nodes $582_1$ to $582_n$ for transmission. The RF signals may then be split to generate multiple signals for transmission via multiple channels by each of the RF circuits 406. For example, with respect to RF circuit $406_1$, the RF signal at node $582_1$ may be fed to a splitter/combiner 526 to generate multiple RF signals for multiple channels $528_1$ to $528_n$ (collectively referred to as "channels 528"), as illustrated. The splitter/combiner is configured to generate multiple signals by splitting one signal in one direction of signal flow, or generate one signal by combining multiple signals in the opposite direction of signal flow. For example, during reception, signals received via the channels 528 may be combined by a respective splitter/combiner 526. The combined signals generated by the splitter/combiner 526 may be downconverted by a respective one of the mixers 524 before being multiplexed via multiplexers 522 and provided to the converter circuits 560.

Each channel $528_1$ to $528_n$ may include a weight adjustment circuit $530_1$ to $530_n$ (collectively referred to as "weight adjustment circuits 530"), which may be used to adjust an amplitude and/or phase of transmit and/or receive signals, as will be described in more detail herein. The weight adjustment circuits $530_1$ to $530_n$ may be coupled to antenna terminals $540_1$ to $540_n$ (collectively referred to as "antenna terminals 540") through a respective one of switches $531_1$ to $531_n$ (collectively referred to as "switches 531") and a respective one of switches $533_1$ to $533_n$ (collectively referred to as "switches 533") Each of the antenna terminals 540 may be coupled to an antenna $542_1$ to $542_n$. The switches 531 and 533 are configured to selectively couple a respective one of the PAs $534_1$ to $534_n$ or a respective one of the LNAs $532_1$ to $532_n$ between a respective one of the weight adjustment circuits 530 and a respective one of the antenna terminals 540. As illustrated, each of the RF circuits 406 may be implemented in a similar fashion as described with respect to the RF circuit $406_1$.

Certain aspects of the present disclosure provide a dynamically reconfigurable radio supporting RF BF plus diversity communication. For example, a controller 570 in the BB module 402 may be used to perform amplitude and/or phase weighting, via the weight adjustment circuits (e.g., weight adjustment circuits 530), for signals to be transmitted or received. For example, the BB module 402 may generate control signals $597_1$ to $597_n$ (collectively referred to as "control signals 597") to be provided to multiplexers of the converter circuits 560, as illustrated. As previously described, the control signals may be multiplexed with LO and IF signals in the converter module 404 and subsequently extracted in the RFIC 405 and used to control operations of the RF circuits 406, including adjustment of the amplitude and/or phase weighting via the weight adjustment circuits.

The weights may be applied to perform MIMO communication or BF. For example, the controller 570 may be configured to apply amplitude and/or phase weights to BB signals via weight adjustment circuits $561_1$ to $561_n$ (collectively referred to as "weight adjustment circuits 561"). As described in more detail herein, certain aspects of the present disclosure provide apparatus and techniques for applying the amplitude and/or phase weights in the RF domain, as opposed to applying the amplitude and/or phase weights to BB signals, to reduce power consumption.

In certain aspects of the present disclosure, receiver (Rx)/transmitter (Tx) diversity mode amplitude and/or phase weights may be applied in the RF domain using the weight adjustment circuits in the RFIC 405, allowing for a reduction of power consumption by powering down one or more conversion circuits (e.g., the converter circuit $560_n$) and the weight adjustment circuits 561 in the BB module 402. For example, only a single converter circuit of the converter circuits 560 may be enabled to perform frequency conversion during reception and transmission for the RF circuits 406. Moreover, one or more of the weight adjustment circuits 561 may not be enabled when the weight adjustment is being performed in the RF domain. In certain aspects, the controller 570 in the BB module 402 may be implemented as a digital signal processor (DSP) that provides control signals 597 for controlling the amplitude and/or phase adjustment parameters of the weight adjustment circuits 530 of the RF circuits 406 to perform amplitude and/or phase weighting.

In certain aspects of the present disclosure, modes of operation where a common data stream is used for transmission or reception via multiple RF circuits 406 may be determined. In these modes, one or more of the converter circuits 560 may be powered down, as previously described, because a single conversion circuit can provide or process the common data streams for multiple RF chains with amplitude and/or phase weights applied in the RF domain. Some examples of such a mode of operation are diversity communication mode and carrier aggregation (CA). For example, in diversity communication mode, the same signal may be transmitted on each of the groups of antennas coupled to the RF circuits 406. Thus, instead of applying weights in baseband (e.g., using weight adjustment circuits 561), the weights for diversity may be applied in the RF domain (e.g., in the RFIC 405) via the weight adjustment circuits 530 of the RF circuits 406, as previously described. Therefore, instead of having each of the converter circuits 560 perform signal conversion for one of the RF circuits 406, a single converter circuit (e.g., converter circuit $560_1$) may process the signals, and the other converter circuits may be powered down to reduce power consumption.

In this case, a signal path 580 (or a signal path 590) may be selectively coupled between the RF circuits 406 to allow for the transfer of the RF signal (or IF signal) between the RF circuits 406. For example, the converter circuit $560_1$ may generate the multiplexed signal at node $581_1$, and the multiplexed signal may be transferred to node $581_n$ for transmission via the RF circuit $406_n$. Nodes $581_1$ to $581_n$ may also be referred to as RF nodes. In some cases, the signal path 590 may be coupled between nodes $582_1$ to $582_n$ in order to avoid performing an additional step of multiplexing/demultiplexing and upconversion/downconversion via the multiplexer $522_n$ and the mixer $524_n$. In certain aspects, the signal paths 580 and 590 may be implemented using one or more switches to allow for the signal paths 580 and 590 to be selectively coupled as desired depending on the wireless communications mode of operation.

In some cases, the amplitude and/or phase adjustment parameters of the weight adjustment circuits may be set to facilitate both diversity communication and BF. For example, the controller 570 may determine BF weights and diversity weights for each of the channels of the RF circuits 406, and combine the BF weights and diversity weights for each of the channels. The controller 570 may then provide a control signal to each of the weight adjustment circuits of the RF circuits 406 to set amplitude and/or phase adjustment parameters based on the combined BF and diversity weights.

In certain aspects, the weight adjustment circuits as described herein may be implemented using variable gain amplifiers (VGAs) and variable phase shifters. In some cases, the phase adjustment operation of the weight adjustment circuits may be implemented by selecting between different LOs at various mixers and performing post mixing (e.g., combining) to get variable phases.

Figure 6:
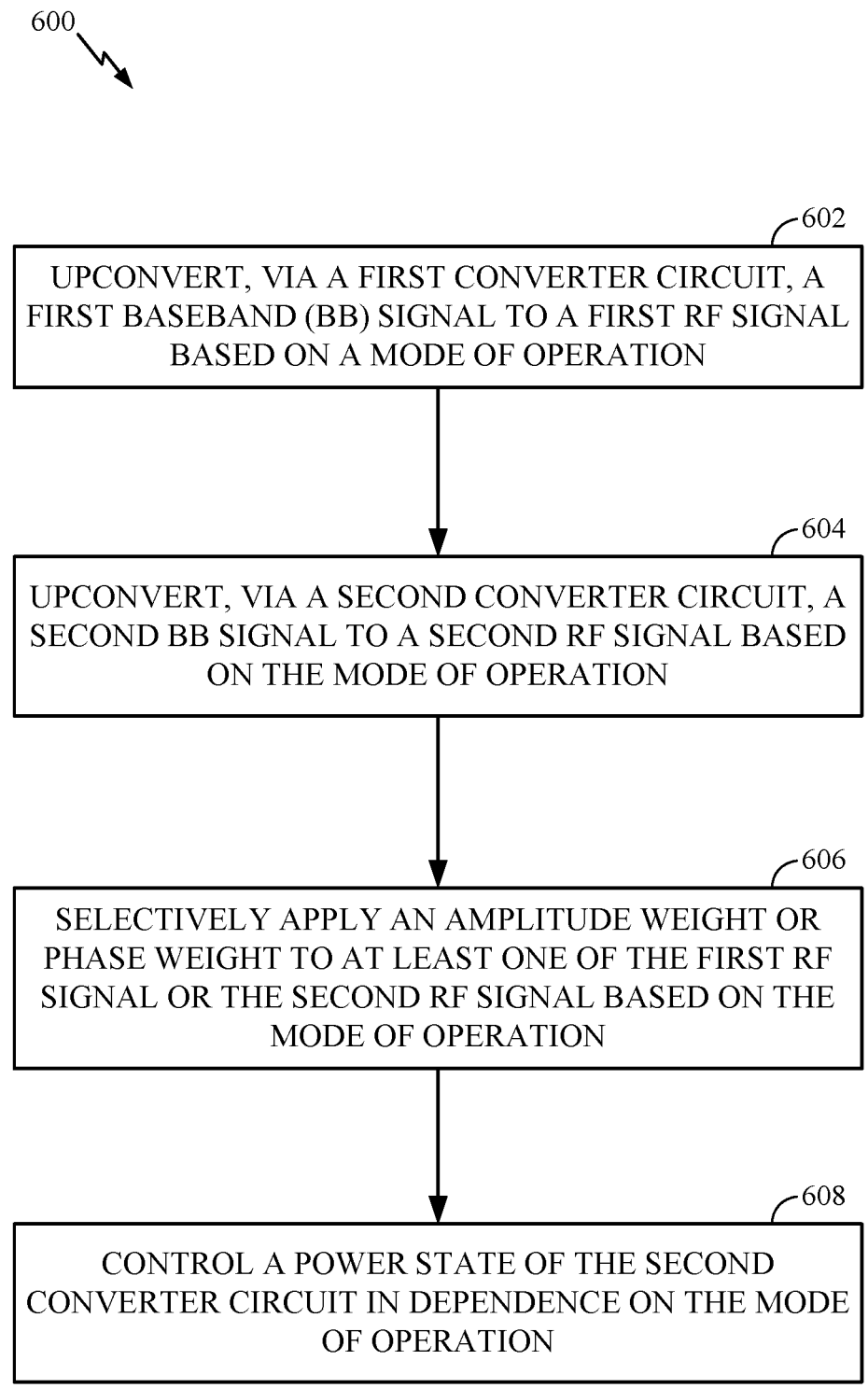
FIG. 6 is a flow diagram illustrating example operations for wireless communications during transmission, in accordance with certain aspects of the present disclosure.

FIG. 6 is a flow diagram illustrating example operations 600 for wireless communications, in accordance with certain aspects of the present disclosure. The operations 600 may be performed, for example, by a circuit such as the wireless communications circuit 401 or 500.

The operations 600 may begin, at block 602, by upconverting, via a first converter circuit (e.g., converter circuit 460a), a BB signal to a first RF signal based on a mode of operation, and at block 604, upconverting, via a second converter circuit (e.g., converter circuit 460b), a second BB signal to a second RF signal based on the mode of operation. At block 606, the circuit selectively applies an amplitude weight or phase weight (e.g., via the weight adjustment circuit 467a) to at least one of the first RF signal or the second RF signal based on the mode of operation and, at block 608, controls (e.g., via controller 570) a power state of the second converter circuit in dependence on the mode of operation. In certain aspects, the circuit also controls the amplitude weight and the phase weight in dependence on the mode of operation.

In certain aspects, the circuit selectively applies a baseband amplitude weight or a baseband phase weight (e.g., via digital beamforming module 409) to at least one of the first baseband signal or the second baseband signal based on the mode of operation. In certain aspects, the selectively applying the baseband amplitude weight or the BB phase weight comprises providing amplitude and phase weights to the first BB signal and the second baseband signal in a MIMO mode of operation.

In certain aspects, the upconverting of at least one of the first BB signal or the second BB signal involves providing a single frequency conversion (e.g., as opposed to a conversion to IF and another conversion to RF) for upconverting at least one of the first BB signal to the first RF signal or the second BB signal to the second RF signal. In certain aspects, the circuit downconverts a received RF signal to a received baseband signal.

In certain aspects, the amplitude weight or phase weight is selectively applied via a first RF weight adjustment circuit (e.g., weight adjustment circuit 467a). In this case, the circuit may selectively couple the first converter circuit to the first RF weight adjustment circuit and a second RF weight adjustment circuit (e.g., weight adjustment circuit 467b) in dependence on the mode of operation. The circuit also controls the amplitude weight and the phase weight of the first RF weight adjustment circuit and another amplitude weight and another phase weight of the second RF weight adjustment circuit in dependence on the mode of operation being a diversity mode of operation.

Figure 7:
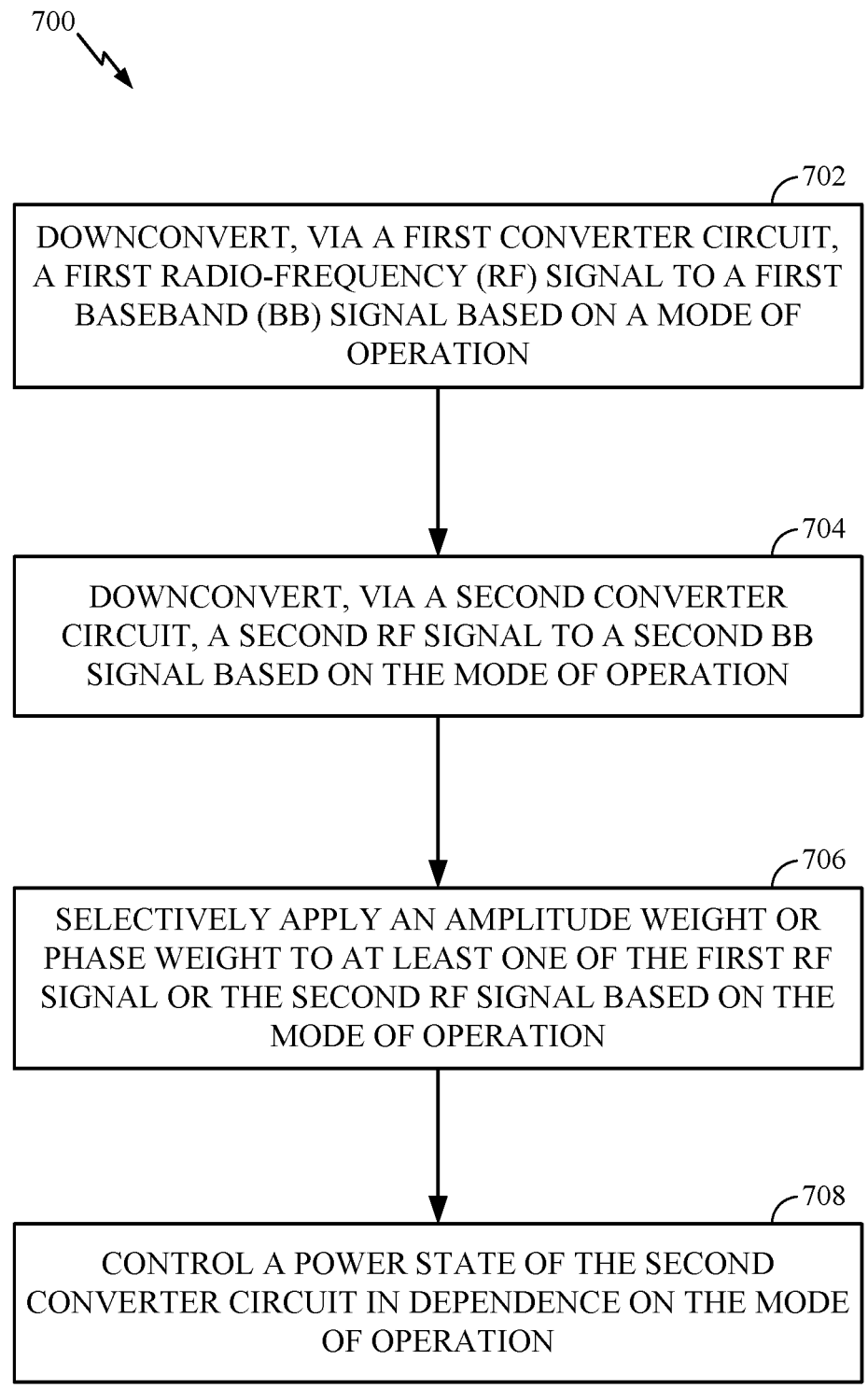
FIG. 7 is a flow diagram illustrating example operations for wireless communications during reception, in accordance with certain aspects of the present disclosure.

FIG. 7 is a flow diagram illustrating example operations 700 for wireless communications, in accordance with certain aspects of the present disclosure. The operations 700 may be performed, for example, by a circuit such as the wireless communications circuit 401 or 500.

The operations 700 may begin, at block 702, by downconverting, via a first converter circuit (e.g., converter circuit $560_1$), a first RF signal to a first BB signal based on a mode of operation, and at block 704, downconverting, via a second converter circuit (e.g., converter circuit $560_n$), a second RF signal to a second BB signal based on the mode of operation (e.g., MIMO mode of operation or diversity mode of operation). At block 706, the circuit selectively applies an amplitude weight or phase weight (e.g., via the RF circuit $406_1$) to at least one of the first RF signal or the second RF signal based on the mode of operation and, at block 708, controls (e.g., via controller 570) a power state of the second converter circuit in dependence on the mode of operation. In certain aspects, the circuit also controls the amplitude weight and the phase weight in dependence on the mode of operation.

In certain aspects, the circuit selectively applies a baseband amplitude weight or a baseband phase weight (e.g., via weight adjustment circuit $561_1$) to at least one of the first BB signal or the second BB signal based on the mode of operation. In some cases, the selectively applying the baseband amplitude weight or the baseband phase weight comprises providing amplitude and phase weights to the first BB signal and the second BB signal in a MIMO mode of operation.

In certain aspects, the downconverting of at least one of the first RF signal or the second RF signal involves a single frequency conversion for downconverting at least one of the first RF signal to the first BB signal or the second RF signal to the second BB signal. In some cases, the circuit downconverts a received RF signal to a received baseband signal.

In certain aspects, the amplitude weight or phase weight is selectively applied via a first RF weight adjustment circuit (e.g., weight adjustment circuits $530_1$). In this case, the circuit selectively couples the first converter circuit to the first RF weight adjustment circuit and a second RF weight adjustment circuit (e.g., weight adjustment circuits $530_n$) in dependence on the mode of operation. Moreover, the circuit controls the amplitude weight and the phase weight of the first RF weight adjustment circuit and another amplitude weight and another phase weight of the second RF weight adjustment circuit in dependence on the mode of operation being a diversity mode of operation.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering. For example, means for upconverting may be performed, for example, by a converter circuit, such as the converter circuits 460a-460d. Means for selectively applying amplitude weight or phase weight may be performed by a weight adjustment circuit, such as the weight adjustment circuits 467a-467d. Means for controlling a power state may be performed by a controller, such as the BB processor 411.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An apparatus for wireless communications, the apparatus comprising:
   a first converter circuit configured to upconvert a first baseband (BB) signal to a first radio-frequency (RF) signal based on a mode of operation;
   a second converter circuit configured to upconvert a second BB signal to a second RF signal based on the mode of operation;
   a first RF weight adjustment circuit configured to selectively apply an amplitude weight or a phase weight to at least one of the first RF signal or the second RF signal based on the mode of operation; and
   a controller configured to control a power state of the second converter circuit in dependence on the mode of operation, wherein controlling the power state of the second converter circuit comprises selectively transitioning the second converter circuit to a low power state based on whether the mode of operation is a diversity or a beamforming mode of operation.

2. The apparatus of claim 1, wherein the controller is further configured to control the amplitude weight and the phase weight in dependence on the mode of operation.

3. The apparatus of claim 1, further comprising a digital beamforming module configured to selectively apply a BB amplitude weight or a BB phase weight to at least one of the first BB signal or the second BB signal based on the mode of operation.

4. The apparatus of claim 3, wherein the digital beamforming module is configured to provide amplitude and phase weights to the first BB signal and the second BB signal in a multiple-input, multiple-output (MIMO) mode of operation.

5. The apparatus of claim 1, wherein the mode of operation comprises the diversity mode of operation.

6. The apparatus of claim 1, wherein the mode of operation comprises a multiple-input, multiple-output (MIMO) mode of operation.

7. The apparatus of claim 1, wherein at least one of the first converter circuit or the second converter circuit is configured to provide a single frequency conversion of the first BB signal and the second BB signal to the first RF signal and the second RF signal, respectively.

8. The apparatus of claim 1, wherein at least one of the first converter circuit or the second converter circuit is further configured to downconvert a received RF signal to a BB signal.

9. The apparatus of claim 1, further comprising:
   a second RF weight adjustment circuit; and
   a configurable signal splitter coupled to the first converter circuit and configured to selectively couple the first converter circuit to the first RF weight adjustment circuit and the second RF weight adjustment circuit in dependence on the mode of operation,
   wherein the controller is further configured to control the amplitude weight and the phase weight of the first RF weight adjustment circuit and another amplitude weight and another phase weight of the second RF weight adjustment circuit in dependence on the mode of operation being the diversity mode of operation.

10. A method for wireless communications, comprising:
    upconverting, via a first converter circuit, a first baseband (BB) signal to a first radio-frequency (RF) signal based on a mode of operation;
    upconverting, via a second converter circuit, a second BB signal to a second RF signal based on the mode of operation;
    selectively applying an amplitude weight or a phase weight to at least one of the first RF signal or the second RF signal based on the mode of operation; and
    controlling a power state of the second converter circuit in dependence on the mode of operation, wherein controlling the power state of the second converter circuit comprises selectively transitioning the second converter circuit to a low power state based on whether the mode of operation is a diversity or a beamforming mode of operation.

11. The method of claim 10, further comprising controlling the amplitude weight and the phase weight in dependence on the mode of operation.

12. The method of claim 10, further comprising selectively applying a BB amplitude weight or a BB phase weight to at least one of the first BB signal or the second BB signal based on the mode of operation.

13. The method of claim 12, wherein selectively applying the BB amplitude weight or the BB phase weight comprises providing amplitude and phase weights to the first BB signal and the second BB signal in a multiple-input, multiple-output (MIMO) mode of operation.

14. The method of claim 10, wherein the mode of operation comprises the diversity mode of operation.

15. The method of claim 10, wherein the mode of operation comprises a multiple-input, multiple-output (MIMO) mode of operation.

16. The method of claim 10, wherein upconverting at least one of the first BB signal or the second BB signal comprises providing a single frequency conversion for upconverting at least one of the first BB signal to the first RF signal or the second BB signal to the second RF signal.

17. The method of claim 10, further comprising downconverting, via at least one of the first converter circuit or the second converter circuit, a received RF signal to a BB signal.

18. The method of claim 10, wherein the amplitude weight or the phase weight is selectively applied via a first RF weight adjustment circuit, the method further comprising:
selectively coupling the first converter circuit to the first RF weight adjustment circuit and a second RF weight adjustment circuit in dependence on the mode of operation; and
controlling the amplitude weight and the phase weight of the first RF weight adjustment circuit and another amplitude weight and another phase weight of the second RF weight adjustment circuit in dependence on the mode of operation being the diversity mode of operation.

19. A method for wireless communications, comprising:
downconverting, via a first converter circuit, a first radio-frequency (RF) signal to a first baseband (BB) signal based on a mode of operation;
downconverting, via a second converter circuit, a second RF signal to a second BB signal based on the mode of operation;
selectively applying an amplitude weight or a phase weight to at least one of the first RF signal or the second RF signal based on the mode of operation; and
controlling a power state of the second converter circuit in dependence on the mode of operation, wherein controlling the power state of the second converter circuit comprises selectively transitioning the second converter circuit to a low power state based on whether the mode of operation is a diversity or a beamforming mode of operation.

20. The method of claim 19, further comprising controlling the amplitude weight and the phase weight in dependence on the mode of operation.

21. The method of claim 19, further comprising selectively applying a BB amplitude weight or a BB phase weight to at least one of the first BB signal or the second BB signal based on the mode of operation.

22. The method of claim 21, wherein selectively applying the BB amplitude weight or the BB phase weight comprises providing amplitude and phase weights to the first BB signal and the second BB signal in a multiple-input, multiple-output (MIMO) mode of operation.

23. The method of claim 19, wherein the mode of operation comprises the diversity mode of operation.

24. The method of claim 19, wherein the mode of operation comprises a multiple-input, multiple-output (MIMO) mode of operation.

25. The method of claim 19, wherein downconverting at least one of the first RF signal or the second RF signal comprises providing a single frequency conversion for downconverting at least one of the first RF signal to the first BB signal or the second RF signal to the second BB signal.

26. The method of claim 19, further comprising upconverting, via at least one of the first converter circuit or the second converter circuit, a BB signal to an RF signal for transmission.

27. The method of claim 19, wherein the amplitude weight or the phase weight is selectively applied via a first RF weight adjustment circuit, the method further comprising:
selectively coupling the first converter circuit to the first RF weight adjustment circuit and a second RF weight adjustment circuit in dependence on the mode of operation; and
controlling the amplitude weight and the phase weight of the first RF weight adjustment circuit and another amplitude weight and another phase weight of the second RF weight adjustment circuit in dependence on the mode of operation being the diversity mode of operation.

28. An apparatus for wireless communications, comprising:
means for upconverting a first baseband (BB) signal to a first radio-frequency (RF) signal based on a mode of operation;
means for upconverting a second BB signal to a second RF signal based on the mode of operation;
means for selectively applying an amplitude weight or a phase weight to at least one of the first RF signal or the second RF signal based on the mode of operation; and
means for controlling a power state of the means for upconverting the second BB signal, in dependence on the mode of operation, wherein controlling the power state of the means for upconverting the second BB signal comprises selectively transitioning the means for upconverting the second BB signal to a low power state based on whether the mode of operation is a diversity or a beamforming mode of operation.

29. The apparatus of claim 1, wherein controlling the power state of the second converter circuit comprises transitioning the second converter circuit to the low power state in the diversity mode of operation.

* * * * *